United States Patent
Kouno et al.

(10) Patent No.: US 8,507,189 B2
(45) Date of Patent: Aug. 13, 2013

(54) UPPER LAYER FILM FORMING COMPOSITION AND METHOD OF FORMING PHOTORESIST PATTERN

(75) Inventors: Daita Kouno, Tokyo (JP); Hiromitsu Nakashima, Tokyo (JP); Yukio Nishimura, Tokyo (JP)

(73) Assignee: JSR Corporation, Tokyo (JP)

( * ) Notice: Subject to any disclaimer, the term of this patent is extended or adjusted under 35 U.S.C. 154(b) by 417 days.

(21) Appl. No.: 12/442,377

(22) PCT Filed: Sep. 21, 2007

(86) PCT No.: PCT/JP2007/068399
§ 371 (c)(1),
(2), (4) Date: Mar. 20, 2009

(87) PCT Pub. No.: WO2008/038590
PCT Pub. Date: Apr. 3, 2008

(65) Prior Publication Data
US 2010/0040974 A1   Feb. 18, 2010

(30) Foreign Application Priority Data

Sep. 27, 2006 (JP) .................................. 2006-262214
Feb. 1, 2007 (JP) .................................. 2007-022828

(51) Int. Cl.
*G03F 7/11* (2006.01)
*G03F 7/26* (2006.01)

(52) U.S. Cl.
USPC ............... 430/322; 430/271.1; 430/273.1; 430/326

(58) Field of Classification Search
USPC ............... 430/270.1, 271.1, 273.1, 322, 326
See application file for complete search history.

(56) References Cited

U.S. PATENT DOCUMENTS

| | | | |
|---|---|---|---|
| 5,631,314 A * | 5/1997 | Wakiya et al. ................. | 524/165 |
| 6,756,179 B2 * | 6/2004 | Fujimori et al. ............ | 430/270.1 |
| 7,455,952 B2 * | 11/2008 | Hatakeyama et al. ..... | 430/273.1 |
| 2005/0202340 A1 * | 9/2005 | Houlihan et al. ........... | 430/270.1 |
| 2006/0024613 A1 * | 2/2006 | Otozawa et al. ............ | 430/270.1 |
| 2007/0031755 A1 | 2/2007 | Hirayama et al. | |
| 2007/0087125 A1 * | 4/2007 | Maeda et al. ................. | 427/402 |
| 2007/0160930 A1 * | 7/2007 | Wang et al. ................. | 430/270.1 |
| 2007/0252111 A1 | 11/2007 | Ohkubo et al. | |
| 2008/0032202 A1 | 2/2008 | Ishizuka et al. | |
| 2008/0038661 A1 | 2/2008 | Chiba et al. | |
| 2008/0248427 A1 * | 10/2008 | Thiyagarajan et al. .... | 430/287.1 |
| 2008/0299503 A1 | 12/2008 | Ishiduka et al. | |
| 2008/0311523 A1 | 12/2008 | Endo et al. | |
| 2008/0311530 A1 * | 12/2008 | Allen et al. .................... | 430/327 |

FOREIGN PATENT DOCUMENTS

| | | | |
|---|---|---|---|
| JP | 10-120968 | | 5/1998 |
| JP | 11-176727 | | 9/1999 |
| JP | 2005-99648 | | 4/2005 |
| JP | 2005-264131 | | 9/2005 |
| JP | 2006-58404 | | 3/2006 |
| JP | 2006-064711 | | 3/2006 |
| JP | 2006-117925 | | 5/2006 |
| JP | 2006-184574 | | 7/2006 |
| JP | 2006-308814 | | 11/2006 |
| WO | WO 2005/019937 | * | 3/2005 |

* cited by examiner

*Primary Examiner* — Anca Eoff
(74) *Attorney, Agent, or Firm* — Ditthavong Mori & Steiner, P.C.

(57) ABSTRACT

An upper layer film forming composition for forming an upper layer film on the surface of a photoresist film includes (A) a resin dissolvable in a developer for the photoresist film and (B) a compound having a sulfonic acid residue group, the composition forming an upper layer film with a receding contact angle to water of 70° or more. The upper layer film forming composition of the present invention can form an upper layer film which has a sufficient transparency and is stably maintained without eluting the components into a medium without being intermixed with a photoresist film, can form a resist pattern with high resolution while effectively suppressing a defect, and can suppress a blob defect.

3 Claims, 1 Drawing Sheet

UPPER LAYER FILM FORMING COMPOSITION AND METHOD OF FORMING PHOTORESIST PATTERN

TECHNICAL FIELD

The present invention relates to an upper layer film forming composition useful for protecting a photoresist in liquid immersion lithography used for miniaturization of lithography and also for protecting a lens used in a projection aligner by suppressing elusion of photoresist components, and to a method of forming a photoresist pattern using the upper layer film.

BACKGROUND ART

A stepper-type or step-and-scan-type projection aligner is used in the manufacture of semiconductor devices and the like to transfer a reticle pattern as a photo mask to each shot region on a wafer coated with a photoresist through a projection optical system.

Resolution of a projection optical system used in a projection aligner increases as the exposure wavelength decreases and the numerical aperture of the projection optical system increases. Therefore, the exposure wavelength which is a wavelength of radiation used in the projection aligner has been reduced in accordance with scaling down of integrated circuits year by year, and the numerical aperture of the projection optical system has been increased.

Depth of focus is as important as resolution when a resist is exposed to radiation. The resolution (R) and the depth of focus ($\delta$) are shown by the following formulas:

$$R = k_1 \cdot \lambda / NA \quad \text{(i)}$$

$$\delta = k_2 \cdot \lambda / NA^2 \quad \text{(ii)}$$

wherein $\lambda$ is the exposure wavelength, NA is the numerical aperture of the projection optical system, and $k_1$ and $k_2$ are process coefficients. When obtaining the same resolution R, a larger depth of focus $\delta$ is obtained by using radiation with a shorter wavelength.

In this instance, a photoresist film is formed on the surface of the exposed wafer, and a pattern is transferred onto this photoresist film. In a generally-used projection aligner, the space in which the wafer is disposed is filled with air or nitrogen. When the space between the wafer and the lens of the projection aligner is filled with a medium having a refractive index of n, the resolution R and the depth of focus $\delta$ are shown by the following formulas.

$$R = k_1 \cdot (\lambda / n) / NA \quad \text{(iii)}$$

$$\delta = k_2 \cdot n \cdot \lambda / NA^2 \quad \text{(iv)}$$

For example, when water is used as the above medium in an ArF process, the resolution R is 69.4% ($R = k_1 \cdot (\lambda/44)/NA$) and the depth of focus is 144% ($\delta = k_2 \cdot 1.44 \lambda / NA^2$) with respect to in which the photoresist is exposed through the air or nitrogen, when the refractive index of light with a wavelength of 193 nm in water is n=1.44.

Such a projection exposure method in which the wavelength of exposure radiation is reduced to transfer a more minute pattern is called liquid immersion lithography. The liquid immersion lithography is considered to be an essential technology for lithography with reduced dimensions, particularly for lithography with dimensions of several tens of nanometers. A projection aligner used for the method is known (see Patent Document 1).

In the liquid immersion lithographic method using water as a medium of immersion, a photoresist film formed on a wafer and the lens of a projection aligner are brought into contact with water. For this reason, water may permeate the photoresist film and decrease the resolution. In addition, the photoresist may elute its components into water, and the water may pollute the surface of the lens of a projection aligner.

A method of forming an upper layer film on a photoresist film may be used in order to block the photoresist film from the medium such as water. Such an upper layer film must possess sufficient transparency to radiation of a wavelength used in liquid immersion lithography, must form a protective film on a photoresist film while causing almost no intermixing with the photoresist film, must be stably maintained without being dissolved in the medium such as water during liquid immersion lithography, and must be easily dissolved in a developer such as an alkaline solution.

Although the resist pattern forming methods described in Patent Documents 2 and 3 can suppress a watermark defect which is a phenomenon of leaving scars of immersion liquid droplets on a resist pattern caused by an immersion liquid penetrating a protective film and remaining therein and a pattern defect which is an irregular pattern in which the line width is large in some areas, but small in other areas, these methods have another problem of a blob defect which is caused by reattachment during a rinsing operation. In other words, although a resist pattern with high resolution can be expected while effectively suppressing the watermark defect and the pattern defect when using the resist pattern forming methods described in Patent Documents 2 and 3, these methods are not sufficient because of occurrence of the blob defect. Therefore, further improvement has been desired.

Patent Document 1: JP 11-176727 A

Patent Document 2: JP 2005-264131 A

Patent Document 3: JP 2006-64711 A

DISCLOSURE OF THE INVENTION

The present invention has been conducted to overcome these problems and has an object of providing an upper layer film forming composition, which can form a film possessing sufficient transparency to radiation, particularly to light with a wavelength of 248 nm (KrF) and 193 nm (ArF), on a photoresist film while causing almost no intermixing with the photoresist film, is stably maintained without being dissolved in a medium such as water during liquid immersion lithography, is capable of forming a resist pattern with high resolution while effectively suppressing a watermark defect and a pattern defect, and is capable of suppressing a blob defect, and also has an object of providing a method for forming a photoresist pattern.

According to the present invention, the following upper layer film forming composition is provided.

[1] An upper layer film forming composition for forming an upper layer film on the surface of a photoresist film, comprising (A) a resin dissolvable in a developer for the photoresist film and (B) a compound having a sulfonic acid residue group, the composition forming an upper layer film with a receding contact angle to water of 70° or more.

[2] An upper layer film forming composition for forming an upper layer film on the surface of a photoresist film, comprising (A) a resin dissolvable in a developer for the photoresist film and (B) a compound shown by the following formula (2),

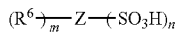

(2)

wherein $R^6$ individually represents a linear or branched alkyl group having 1 to 10 carbon atoms, an alicyclic alkyl group having 3 to 10 carbon atoms or a derivative thereof, a hydroxyl group, a carboxyl group, an alkyl ether group, an alkyloxycarbonyl group, or an alkylcarbonyloxy group; Z represents a linear, branched or alicyclic hydrocarbon having 4 to 12 carbon atoms or a substituted or unsubstituted aromatic hydrocarbon; m is 0 to 4; and n is 1 to 4.

[3] The upper layer film forming composition according to [2], wherein the resin (A) has at least one repeating unit selected from repeating units shown by the following formulas (1-1), (1-2), and (1-3),

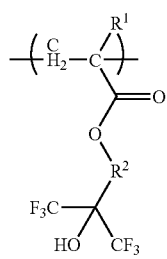

(1-1)

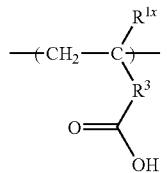

(1-2)

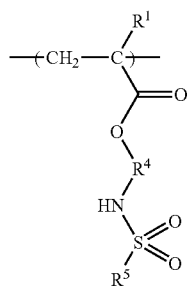

(1-3)

wherein $R^1$ represents a hydrogen atom, a methyl group, or a trifluoromethyl group, $R^2$, $R^3$, and $R^4$ represent a single bond or a divalent organic group, $R^5$ represents a linear or branched alkyl group having 1 to 10 carbon atoms in which at least one hydrogen atom is substituted by a fluorine atom or an alicyclic alkyl group having 3 to 10 carbon atoms, and $R^{1x}$ represents a linear or branched alkyl group having 1 to 3 carbon atoms in which at least one hydrogen atom is substituted by a fluorine atom.

[4] The upper layer film forming composition according to [3], wherein Z in the formula (2) showing the compound (B) is a group derived from an aromatic hydrocarbon.

[5] The upper layer film forming composition according to [4], wherein the amount of the compound (B) is 10 parts by mass or less for 100 parts by mass of the resin (A).

[6] A method of forming a photoresist pattern comprising a step of forming a photoresist film by applying a photoresist to a substrate, a step of forming an upper layer film on the photoresist film, and a step of forming a resist pattern by irradiating the photoresist film and the upper layer film with radiation via an immersion medium through a mask having a specific pattern, and developing the photoresist pattern, wherein the step of forming an upper layer film is carried out using the upper layer film forming composition according to any one of [1] to [5].

[7] The method according to [6], wherein the photoresist is a radiation-sensitive resin composition comprising (a) a resin containing an acid-dissociable group and (b) an acid generator, the resin (a) containing a repeating unit having an acid-dissociable group in an amount of 30 to 60 mol % of the total amount of the resin (a).

Due to the use of the alkali-soluble resin (A) and the compound (B) having a sulfonic acid residue group, the upper layer film forming composition of the present invention can form a film which protect a photoresist film, during liquid immersion lithography, is stably maintained without eluting the components into a medium such as water during liquid immersion lithography, can form a resist pattern with high resolution while effectively suppressing a watermark defect and a pattern defect, and can also suppress a blob defect.

EXPLANATION OF SYMBOLS

Figure 1:
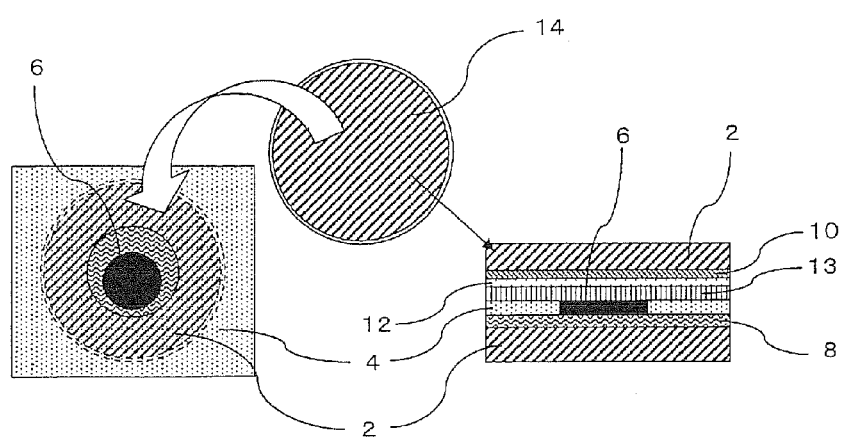
FIG. 1 is a schematic drawing showing measurement of an amount of elution.

| 2 | Silicon wafer |
|---|---|
| 4 | Silicon rubber sheet |
| 6 | Ultra-pure water |
| 8 | HMDS treatment |
| 10 | Lower layer antireflection film (ARC29A) |
| 12 | Resist film |
| 13 | Upper layer film |
| 14 | Silicon wafer with an upper layer film formed thereon |
| 16 | Substrate |
| 18 | Pattern |

BEST MODE FOR CARRYING OUT THE INVENTION

Preferred embodiments of the present invention are described below. Note that the present invention is not limited to the following embodiments. Various modifications and improvements may be made in the following embodiments within the scope of the present invention based on the knowledge of a person skilled in the art.

Upper Layer Film Forming Composition

The upper layer film forming composition is used for forming an upper layer film on the surface of a photoresist film. The photoresist film is preferably from the photoresist composition comprising a resin having an acid-dissociable group (a) and an acid generator (b).

The resin (a) has a repeating unit which contains an acid-dissociable group, of which the amount is preferably 30 to 60 mol % of the total amount of the repeating units of the resin (a). If the amount of the above repeating unit is less than 30 mol %, resolution as a resist may be impaired. If the amount of the repeating unit is more than 60 mol %, the thickness of the resist after removing the upper layer film may be unduly reduced.

Examples of the resin (a) include a resin which has a repeating unit (M-1) of the following formula, a repeating unit (M-2) of the following formula, and a repeating unit (M-3) of the following formula; a resin which has a repeating unit (M-1) of the following formula, a repeating unit (M-2) of the following formula, and a repeating unit (M-4) of the following formula; and a resin which has a repeating unit (M-1) of the following formula, a repeating unit (M-3) of the following formula, and a repeating unit (M-5) of the following formula.

(M-1)

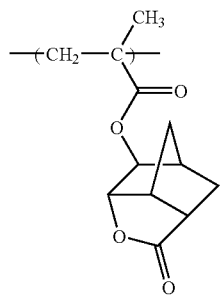

(M-2)

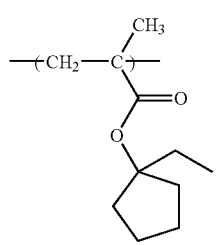

(M-3)

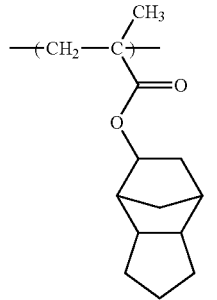

(M-4)

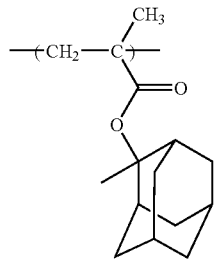

(M-5)

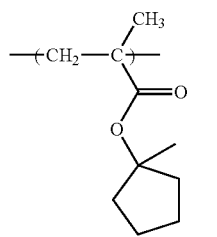

The acid generator (b) generates an acid by irradiation (exposure). An acid-dissociable group which protects an acidic group (such as a carboxyl group) of the resin is dissociated by the action of the generated acid. The acidic group is thus caused to be exposed.

As the acid generator (b), triphenylsulfonium nonafluoro-n-butanesulfonate, 4-cyclohexylphenyl diphenylsulfonium nonafluoro-n-butanesulfonate, 1-(4-n-butoxynaphthalen-1-yl)tetrahydrothiophenium nonafluoro-n-butanesulfonate, triphenylsulfonium 2-(bicyclo[2.2.1]hept-2'-yl)-1,1,2,2-tetrafluoroethanesulfonate, 1-(4-n-butoxynaphthyl)tetrahydrothiophenium 2-(bicyclo[2.2.1]hept-2'-yl)-1,1,2,2-tetrafluoroethanesulfonate, triphenylsulfonium 2-(bicyclo[2.2.1]hept-2'-yl)-1,1-difluoroethanesulfonate, and the like can be used.

When water is used as an immersion medium, the upper layer film made from the upper layer film forming composition inhibits the photoresist film from coming into direct contact with water during the liquid immersion lithography, thereby preventing the photoresist film from reducing the lithographic performance due to penetration of water and preventing the lens of the projection aligner from being polluted with components eluted from the photoresist film.

<Resin (A)>

The resin (A) preferably has at least one repeating unit selected from repeating units shown by the following formulas (1-1), (1-2), and (1-3).

(1-1)

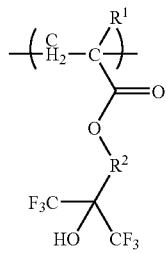

(1-2)

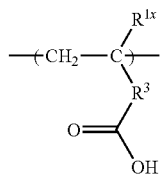

(1-3)

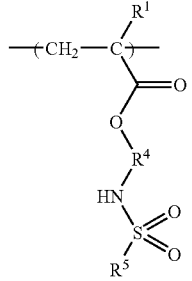

wherein $R^1$ represents a hydrogen atom, a methyl group, or a trifluoromethyl group, $R^2$, $R^3$, and $R^4$ represent a single bond or a divalent organic group, $R^5$ represents a linear or branched alkyl group having 1 to 10 carbon atoms in which at least one hydrogen atom is substituted by a fluorine atom or an alicyclic alkyl group having 3 to 10 carbon atoms, and $R^{1x}$ represents a linear or branched alkyl group having 1 to 3 carbon atoms in which at least one hydrogen atom is substituted by a fluorine atom.

The divalent organic group represented by $R^2$ in the formula (1-1) is preferably a divalent hydrocarbon group. Among the divalent hydrocarbon groups, a linear or cyclic hydrocarbon group is preferable. The divalent organic group represented by $R^2$ may be an alkylene glycol group or an alkylene ester group.

Preferable examples of $R^2$ include saturated linear hydrocarbon groups such as a methylene group, an ethylene group, a propylene group (e.g., 1,3-propylene group, 1,2-propylene group), a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, a 1-methyl-1,3-propylene group, a 2-methyl-1,3-propylene group, a 2-methyl-1,2-propylene group, a 1-methyl-1,4-butylene group, a 2-methyl-1,4-butylene group, a methylidene group, an ethylidene group, a propylidene group, and a 2-propylidene group; monocyclic hydrocarbon groups such as a cycloalkylene group having 3 to 10 carbon atoms including a cyclobutylene group (e.g., 1,3-cyclobutylene group), a cyclopentylene group (e.g., 1,3-cyclopentylene group), a cyclohexylene group (e.g., 1,4-cyclohexylene group), and a cyclooctylene group (e.g., 1,5-cyclooctylene group); crosslinked cyclic hydrocarbon ring groups such as a 2 to 4 member hydrocarbon ring group having 4 to 30 carbon atoms including norbornylene groups (e.g., 1,4-norbornylene group and 2,5-norbornylene group), an admantylene group (e.g., 1,5-adamantylene group and 2,6-admantylene group); and the like.

When the $R^2$ is a divalent alicyclic hydrocarbon group, it is preferable to insert an alkylene group having 1 to 4 carbon atoms as a spacer between the bis(trifluoromethyl)hydroxymethyl group and the alicyclic hydrocarbon group.

As $R^2$, a hydrocarbon group having a 2,5-norbornylene group, a 1,2-ethylene group, and a propylene group are preferable.

Examples of preferable monomers for the formula (1-1) include 1,1,1-trifluoro-2-trifluoromethyl-2-hydroxy-3-propyl(meth)acrylate, 1,1,1-trifluoro-2-trifluoromethyl-2-hydroxy-4-butyl(meth)acrylate, 1,1,1-trifluoro-2-trifluoromethyl-2-hydroxy-5-pentyl(meth)acrylate, 1,1,1-trifluoro-2-trifluoromethyl-2-hydroxy-4-pentyl(meth)acrylate, 2-{[5-(1',1',1'-trifluoro-2'-trifluoromethyl-2'-hydroxy)propyl]bicyclo[2.2.1]heptyl}(meth)acrylate, and 3-{[8-(1',1',1'-trifluoro-2'-trifluoromethyl-2'-hydroxy)propyl]tetracyclo[6.2.1.1$^{3,6}$.0$^{2,7}$]dodecyl}(meth)acrylate. In the present invention, the term "(meth)acrylate" refers to an acrylate and a methacrylate.

Examples of the linear or branched alkyl group having 1 to 3 carbon atoms in which at least one hydrogen atom is substituted by a fluorine atom represented by $R^{1x}$ in the formula (1-2) include alkyl groups such as a methyl group, an ethyl group, a propyl group, and an isopropyl group in which at least one hydrogen atom is substituted by a fluorine atom.

In the formula (1-2), $R^3$ may be shown by -A-B-, wherein A is a single bond, a carbonyl group, a carbonyloxy group, or an oxycarbonyl group, and B is a single bond or a divalent organic group having 1 to 20 carbon atoms. Examples of the divalent organic group having 1 to 20 carbon atoms include a saturated chain hydrocarbon group such as a methylene group, an ethylene group, a propylene group (e.g., 1,3-propylene group and 1,2-propylene group), a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, a 1-methyl-1,3-propylene group, a 2-methyl-1,3-propylene group, a 2-methyl-1,2-propylene group, a 1-methyl-1,4-butylene group, a 2-methyl-1,4-butylene group, a methylidene group, an ethylidene group, a propylidene group, and a 2-propylidene group; a monocyclic hydrocarbon group such as a cycloalkylene group having 3 to 10 carbon atoms including an arylene group (e.g., phenylene group and tolylene group), a cyclobutylene group (e.g., 1,3-cyclobutylene group), a cyclopentylene group (e.g., 1,3-cyclopentylene group), a cyclohexylene group (e.g., 1,4-cyclohexylene group), and a cyclooctylene group (e.g., 1,5-cyclooctylene group); and a crosslinked cyclic hydrocarbon ring group such as a 2 to 4 member cyclic hydrocarbon group having 4 to 20 carbon atoms including a norbornylene group (e.g., 1,4-norbornylene group and 2,5-norbornylene group) and an adamantylene group (e.g., 1,5-adamantylene group and 2,6-adamantylene group).

Examples of preferable monomers for the repeating unit shown by the formula (I-2) include (monofluoromethyl)acrylate, (difluoromethyl)acrylate, (trifluoromethyl)acrylate, (monofluoroethyl)acrylate, (difluoroethyl)acrylate, (trifluoroethyl)acrylate, (tetrafluoroethyl)acrylate, and (pentafluoroethyl)acrylate.

The divalent organic group shown by $R^4$ in the formula (1-3) is preferably a divalent hydrocarbon group. The divalent hydrocarbon group is preferably a chain-like or cyclic hydrocarbon group and may be an alkylene glycol group or an alkylene ester group.

Preferable examples of $R^4$ include an saturated chain hydrocarbon group such as a methylene group, an ethylene group, a propylene group (1,3-propylene group and 1,2-propylene group), a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, a 1-methyl-1,3-propylene group, a 2-methyl-1,3-propylene group, a 2-methyl-1,2-propylene group, a 1-methyl-1,4-butylene group, a 2-methyl-1,4-butylene group, a methylidene group, an ethylidene group, a propylidene group, and a 2-propyliden group; a monocyclic hydrocarbon ring group such as a cycloalkylene group having 3 to 10 carbon atoms including a cyclobutylene group (e.g., 1,3-cyclobutylene group), a cyclopentylene group (e.g., 1,3-cyclopentylene group), a cyclohexylene group (e.g., 1,4-cyclohexylene group), and a cyclooctylene group (e.g., 1,5-cyclooctylene group); and a crosslinked cyclic hydrocarbon ring group such as a 2 to 4 member hydrocarbon ring group having 4 to 30 carbon atoms including a norbornylene group (e.g., 1,4-norbornylene group and 2,5-norbornylene group) and an adamantylene group (e.g., 1,5-adamantylene group and 2,6-adamantylene group).

$R^5$ in the formula (1-3) is a linear or branched alkyl group having 1 to 10 carbon atoms in which at least one hydrogen atom is substituted by a fluorine atom or an alicyclic alkyl group having 3 to 10 carbon atoms. For example, a trifluoromethyl group is preferable.

Examples of preferable monomers for the formula (1-3) include ((((trifluoromethyl)sulfonyl)amino)ethyl-1-methacrylate, 2-(((trifluoromethyl)sulfonyl)amino)ethyl-1-acrylate, and compounds shown by the following formulas.

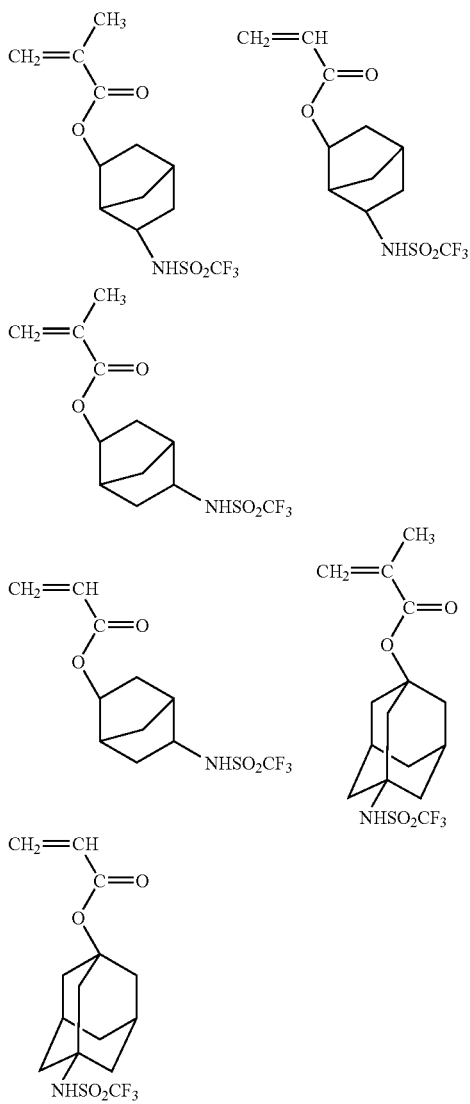

The resin (A) contains at least one repeating unit selected from the group consisting of a repeating unit having a group shown by the formula (1-1), a repeating unit having a group shown by the formula (1-2), and a repeating unit having a group shown by the formula (1-3). These repeating units may be incorporated in the resin by polymerizing a radically-polymerizable monomer which has one of such a repeating unit and a polymerizable unsaturated bond.

In addition, other radically-polymerizable monomers may be copolymerized with the resin component of the upper layer film forming composition of the present invention in order to control the molecular weight, the glass transition temperature, the solubility in solvents, and the like of the resin. The "other radically-polymerizable monomers" refer to radically-polymerizable monomers other than the above-described radically-polymerizable monomers. In addition, monomers having an acid-dissociable group may be copolymerized.

Examples of other radically-polymerizable monomers and the monomers having an acid-dissociable group include alkyl (meth)acrylates such as methyl (meth)acrylate, ethyl (meth)acrylate, n-butyl (meth)acrylate, sec-butyl (meth)acrylate, tert-butyl (meth)acrylate, isopropyl (meth)acrylate, n-hexyl (meth)acrylate, cyclohexyl (meth)acrylate, 2-methylcyclohexyl (meth)acrylate, dicyclopentanyloxyethyl (meth)acrylate, isobornyl (meth)acrylate, dicyclopentanyl (meth)acrylate, methoxydipropylene glycol (meth)acrylate, butoxydipropylene glycol (meth)acrylate, methoxydiethylene glycol (meth)acrylate, methoxypropylene glycol (meth)acrylate, 2-methyl-2-adamantyl(meth)acrylate, 2-ethyl 2-adamantyl(meth)acrylate, 2-propyl-2-adamantyl(meth)acrylate, 2-butyl-2-adamantyl(meth)acrylate, 1-methyl-1-cyclohexyl(meth)acrylate, 1-ethyl-1-cyclohexyl(meth)acrylate, 1-propyl-1-cyclohexyl(meth)acrylate, 1-butyl-1-cyclohexyl(meth)acrylate, 1-methyl-1-cyclopentyl(meth)acrylate, 1-ethyl-1-cyclopentyl(meth)acrylate, 1-propyl-1-cyclopentyl(meth)acrylate, 1-butyl-1-cyclopentyl(meth)acrylate, 1-adamantyl-1-methylethyl(meth)acrylate, and 1-bicyclo[2.2.1]heptyl-1-methylethyl (meth)acrylate; dicarboxylic acid diesters such as diethyl maleate, diethyl fumarate, and diethyl itaconate; aryl (meth)acrylate such as phenyl (meth)acrylate and benzyl (meth)acrylate; aromatic vinyls such as stylene, α-methyl stylene, m-methyl stylene, p-methyl stylene, vinyl toluene, and p-methoxy stylene; radically-polymerizable monomers containing a nitrile group such as acrylonitrile and methacrylonitrile; radically-polymerizable monomers containing an amide bond such as acrylamide and methacrylamide; fatty acid vinyls such as vinyl acetate; radically-polymerizable monomers containing chlorine such as vinyl chloride and vinylidene chloride; and conjugated diolefins such as 1,3-butadiene, isoprene, and 1,4-dimethyl butadiene. Among these, alkyl (meth)acrylate, radically-polymerizable monomers having a nitrile group, radically-polymerizable monomers having an amide bond, and alkyl (meth)acrylate having a hydroxyl group are preferable. In the present invention, (meth)acrylate refers to both acrylate and methacrylate.

These monomers may be used individually or in combination of two or more.

When the other radically-polymerizable monomers are copolymerized, the amount of the other radically-polymerizable monomers is preferably 50 mol % or less, and more preferably 40 mol % or less for the total amount of the polymers. If the amount exceeds 50 mol %, the solubility in an alkaline aqueous solution (developer) is lowered and the upper layer film may not be removed. A residue may be left on the resist pattern after development.

Examples of the polymerization solvent used to prepare the resin (A) include alcohols such as methanol, ethanol, 1-propanol, 2-propanol, 1-butanol, 2-butanol, ethylene glycol, diethylene glycol, and propylene glycol; cyclic ethers such as tetrahydrofuran and dioxane; alkyl ethers of polyhydric alcohol such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether, and propylene glycol monoethyl ether; alkyl ether acetates of polyhydric alcohol such as ethylene glycol ethyl ether acetate, diethylene glycol ethyl ether acetate, propylene glycol ethyl ether acetate, and propylene glycol monomethyl ether acetate; aromatic hydrocarbons such as toluene and xylene; ketones such as acetone, methyl ethyl ketone, methyl isobutyl ketone, cyclohexanone, 4-hydroxy-4-methyl-2-pentanone, and diacetone alcohol; and esters such as ethyl acetate, butyl acetate, methyl 2-hydroxy propionate, ethyl 2-hydroxy-2-methyl propionate, ethyl 2-hydroxy-2-methyl propionate, ethyl ethoxy acetate, ethyl hydroxyl acetate, methyl 2-hydroxy-3-methyl butanoate, methyl 3-methoxy propionate, ethyl 3-methoxy propionate, ethyl 3-ethoxy propionate, and methyl 3-ethoxy propionate. Among these, cyclic ethers, alkyl ethers of polyhydric alcohol, alkyl ether acetates of polyhydric alcohol, ketones, and esters are preferable.

A polystyrene-reduced weight average molecular weight (Mw) of the alkali-soluble resin obtained in the above method measured by gel permeation chromatography is usually 2,000 to 100,000, preferably 2,500 to 50,000, and more preferably 3,000 to 20,000. If the Mw of the alkali-soluble resin is less than 2000, water resistance and mechanical properties of the upper layer film are unduly poor; if more than 100,000, solubility of the resin in the above-mentioned solvent is extremely poor. The ratio (Mw/Mn) of the Mw to the polystyrene-reduced number-average molecular weight (Mn) measured by gel permeation chromatography (GPC) is usually 1 to 5, and preferably 1 to 3.

The smaller the amount of the impurities in the resin such as halogens and metals, the better the properties of the upper layer film such as applicability and capability of being homogeneously dissolved in an alkaline developer. The resin can be purified using, for example, a chemical purification method such as washing with water or liquid-liquid extraction or a combination of the chemical purification method and a physical purification method such as ultrafiltration or centrifugation. The resins may be used either individually of in combination of two or more.

The resin (A) contained in the upper layer film forming composition of the present invention can form a film which is stable in a medium such as water during exposure to radiation and is soluble in a developer used for forming a resist pattern.

A film which is stable in a medium such as water during exposure as used herein refers to a film of which the thickness change determined by a later-mentioned evaluation of stability in water is within 3% of the initial film thickness. The term "soluble in a developer used for forming a resist pattern" as used herein refers to the capability of an upper layer being removed without leaving a residue observable by the naked eye on the surface of a resist pattern after developing using alkaline aqueous solution. Specifically, the resin used in the present invention is an alkali-soluble resin which has almost no solubility in a medium such as water, but is dissolved in an alkaline aqueous solution when developing using the alkaline aqueous solution after irradiation. This resin is hereinafter referred to from time to time as an alkali-soluble resin of the present invention.

The upper layer film made from such an alkali-soluble resin inhibits the photoresist film from coming in direct contact with the medium such as water during the liquid immersion lithography, thereby preventing the photoresist film from reducing the lithographic performance due to penetration of the medium and the lens of the projection aligner from being polluted with components eluted from the photoresist film.

<Compound (B) Having Sulfonic Acid Residue Group>

The compound (B) having a sulfonic acid residue group (hereinafter referred to as "compound (B)") of the present invention is preferably a compound shown by the following formula (2),

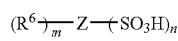   (2)

wherein $R^6$ individually represents a linear or branched alkyl group having 1 to 10 carbon atoms, an alicyclic alkyl group having 3 to 10 carbon atoms or a derivative thereof, a hydroxyl group, a carboxyl group, an alkyl ether group, an alkyloxycarbonyl group, or an alkylcarbonyloxy group; Z represents a linear, branched or alicyclic hydrocarbon having 4 to 12 carbon atoms or a substituted or unsubstituted aromatic hydrocarbon; m is 0 to 4; and n is 1 to 4.

$R^6$ in the formula (2) is a linear or branched alkyl group having 1 to 10 carbon atoms, an alicyclic alkyl group having 3 to 10 carbon atoms or a derivative thereof, a hydroxyl group, a carboxyl group, an alkyl ether group, an alkyloxy carbonyl group, and an alkyl carbonyloxy group. Preferable examples include benzenesulfonic acid, 2-hydroxybenzenesulfonic acid, 3-hydroxybenzenesulfonic acid, 3-sulfosalicylic acid, 4-sulfosalicylic acid, 5-sulfosalicylic acid, 1-naphtylsulfonic acid, 2-naphtylsulfonic acid, cyclohexylsulfonic acid, 2-hydroxycyclohexylsulfonic acid, 3-hydroxycyclohexylsulfonic acid, poly(4-styrenesulfonic acid), and polyvinylnaphthalenesulfonic acid.

The amount of the compound (B) is preferably 0.05 to 10 parts by mass, more preferably 0.05 to 5 parts by mass, and particularly preferably 0.1 to 3 parts by mass for 100 parts by mass of the resin (A).

The upper layer film forming composition for liquid immersion of the present invention may contain a surfactant in order to improve applicability, defoamability, and leveling properties.

As the surfactant, commercially-available fluorine-containing surfactants available under the trade names of BM-1000 and BM-100 (manufactured by BM Chemie), MEGAFAC F142D, F172, F173, and F183 (manufactured by Dainippon Ink and Chemicals), Fluorad FC-135, FC-170C, FC-430, and FC-431 (manufactured by Sumitomo 3M), Surflon S-112, S-113, S-131, S-141, and S-145 (manufactured by Asahi Glass), SH-28PA, SH-190, SH-193, SZ-6032, and SF-8428 (manufactured by Toray Dow Corning Silicone), EMULGEN A-60, 104P, and 306P (manufactured by Kao), and the like can be used.

The amount of the surfactant is preferably 5 parts by weight or less for 100 parts by weight of the alkali-soluble resin.

<Solvent for Upper Film Forming Composition>

A solvent which does not impair lithography performance by causing intermixing with the photoresist film when being applied onto the photoresist film can be used as the solvent to dissolve the resin component of the upper layer film forming composition.

Specific examples of the solvent include monohydric alcohols, polyhydric alcohols, alkyl ethers of polyhydric alcohol, alkyl ether acetates of polyhydric alcohol, ethers, cyclic ethers, higher hydrocarbons, aromatic hydrocarbons, ketones, esters, and water.

As the monohydric alcohols, monohydric alcohols having 4 to 8 carbon atoms are preferable. As examples, 2-methyl-1-propanol, 1-butanol, 2-butanol, 1-pentanol, 2-pentanol, 3-pentanol, 3-methyl-2-pentanol, 4-methyl-2-pentanol, 2-ethyl-1-butanol, 2,4-dimethyl-3-pentanol and the like can be given.

Examples of the polyhydric alcohols include ethylene glycol and propylene glycol; examples of the alkyl ethers of polyhydric alcohol include ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether, and propylene glycol monoethyl ether;

and examples of the alkyl ether acetates of polyhydric alcohol include ethylene glycol ethyl ether acetate, diethylene glycol ethyl ether acetate, propylene glycol ethyl ether acetate, and propylene glycol monomethyl ether acetate.

Examples of the ethers include dipropyl ether, diisopropyl ether, butyl methyl ether, butyl ethyl ether, butyl propyl ether, dibutyl ether, diisobutyl ether, tert-butyl methyl ether, tert-butyl ethyl ether, tert-butyl propyl ether, di-tert-butyl ether, dipentyl ether, diisoamyl ether, cyclopentyl methyl ether, cyclohexyl methyl ether, cyclopentyl ethyl ether, cyclohexyl ethyl ether, cyclopentyl propyl ether, cyclopentyl-2-propyl ether, cyclohexyl propyl ether, cyclohexyl-2-propyl ether, cyclopentyl butyl ether, cyclopentyl tert-butyl ether, cyclohexyl butyl ether, and cyclohexyl tert-butyl ether. Examples of the cyclic ethers include tetrahydrofuran and dioxane.

Examples of the higher hydrocarbons include decane, dodecane, and undecane; examples of the aromatic hydrocarbons include benzene, toluene, and xylene; examples of the ketones include acetone, methyl ethyl ketone, methyl isobutyl ketone, cyclohexanone, 4-hydroxy-4-methyl-2-pentanone, and diaceton alcohol; and examples of the esters include ethyl acetate, butyl acetate, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, and methyl 3-ethoxypropionate.

Among these, monohydric alcohol, ethers, cyclic ethers, alkyl ethers of polyhydric alcohol, alkyl ether acetates of polyhydric alcohol, and higher hydrocarbons are preferable.

<Formation Method of Resist Pattern>

The method of forming a photoresist pattern of the present invention will be described below.

A silicon wafer, a wafer coated with aluminum, and the like can be used as a substrate in the step of forming a photoresist film by coating a photoresist thereon. In order to bring out the potential of the resist film to an maximum extent, an organic or inorganic antireflection film may be formed on the substrate as disclosed in JP 6-12452 B, for example.

The photoresist used is not particularly limited, and may be appropriately selected according to the purpose of the resist. As an example of the resist, a chemically-amplified positive-tone or negative-tone resist containing an acid generator can be given.

A positive-tone resist is particularly preferable when the upper layer film prepared using the composition of the present invention is used. In the case of the chemically-amplified positive-tone resist, the acid-dissociating organic group in the polymer dissociates by the action of the acid generated from the acid generator by exposure to radiation and produces a carboxyl group, for example. As the result, the solubility of the resist in the irradiated part to an alkaline developer is increased. The irradiated part is dissolved and removed by an alkaline developer to produce a positive-tone resist pattern.

The photoresist film is formed by dissolving the resin for forming the photoresist film in an appropriate solvent to make a composition solution with a solid content of 0.1 to 20 wt %, for example, filtering the solution through a filter with a pore size of about 30 nm, for example, to obtain a resist solution, applying the resist solution to a substrate using an appropriate coating method such as rotational coating, cast coating, or roll coating, and prebaking (hereinafter "PB") to volatilize the solvent. A commercially available resist solution may be used as is.

The step of forming an upper layer film on the photoresist film using the upper layer film forming composition comprises coating the upper layer film forming composition of the present invention on the photoresist film and usually sintering the coating again to form upper layer film of the present invention. This step is carried out in order to protect the photoresist film and to form an upper layer film which prevents pollution of the lens of a projection aligner due to elution of components from the photoresist film into the liquid used for the immersion lithography.

The closer the thickness of the upper layer film to an anisoploid of $\lambda/4$ m (wherein $\lambda$ is the wavelength of radiation and m is the refractive index of the upper layer film), the greater the antireflection effect on the upper side surface of the resist film. Therefore, it is preferable to make the upper layer film thickness close to this value. In the present invention, either prebaking after coating the resist solution or baking after coating the upper layer film forming composition solution may be omitted for the sake of simplicity.

In a step of forming a resist pattern, the photoresist film and the upper layer film are irradiated in water used as a medium through a mask having a specified pattern and the irradiated pattern is developed. Specifically, the step comprises performing liquid immersion lithography, baking at a specified temperature, and developing the pattern.

It is possible to adjust the pH of the water filled between the photoresist film and the upper layer film. Purified water is particularly preferable.

As the radiation used for the liquid immersion lithographic method, various types of radiation such as visible light; ultraviolet rays such as g-line and i-line; far ultraviolet rays such as an excimer laser light; X-rays such as synchrotron radiation; and charged particle rays such as electron beams may be selectively used according to the photoresist film used and the combination of the photoresist film and the upper layer film for immersion exposure. An ArF excimer laser (wavelength: 193 nm) or a KrF excimer laser (wavelength: 248 nm) is particularly preferable.

It is preferable to perform post exposure baking (hereinafter "PEB") in order to provide the resist film with improved resolution, pattern profile, developability, and the like. The PEB temperature is appropriately adjusted according to the type of the resist composition in the range usually of 30 to 200° C., and preferably of 50 to 150° C.

Next, the photoresist film is developed using a developer to obtain a desired resist pattern. In this case, it is not necessary to add a step of delaminating the upper film layer for immersion lithography. The upper film layer is completely removed during development or washing after the development. This is one of the important features of the present invention.

As examples of the developer used for forming the resist pattern in the present invention, alkaline aqueous solutions prepared by dissolving alkaline compounds such as sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo-[5.4.0]-7-undecene, and 1,5-diazabicyclo-[4.3.0]-5-nonane can be given. An appropriate amount of a water soluble organic solvent, for example, an alcohol such as methanol and ethanol, and a surfactant can be optionally added to the developer. When developed using the alkaline aqueous solution, the resist is usually washed after development.

EXAMPLES

The present invention will be described in more detail below by way of Synthesis Examples of copolymers (polymers) and Examples of upper layer film forming compositions. The present invention is not limited to the Examples. In the Examples, part(s) means part(s) by mass unless otherwise indicated.

Resin Synthesis Example

The resins (A-1) to (A-3) which can form a film stably in water during exposure to radiation and are soluble in a developer used after resist pattern formation were synthesized by the following method. The Mw and Mn of the resins (A-1) to (A-3) were measured by gel permeation chromatography (GPC) using GPC columns ("G2000H$_{XL}$"×2, "G3000HX$_{XL}$"×1, and "G4000H$_{XL}$"×1, manufactured by Tosoh Corp.) in a high performance GPC apparatus ("HLC-8120" manufactured by Tosoh Corp.) under the following conditions; flow rate: 1.0 ml/minute, eluate: tetrahydrofuran, column temperature: 40° C., standard reference material: monodispersed polystyrene.

Synthesis Example 1

A monomer solution was prepared by dissolving 50 g of (1,1,1-trifluoro-2-trifluoromethyl-2-hydroxy-4-pentyl) methacrylate, 0.78 g of 2,2-azobis(methyl 2-methylisopropionate), and 0.36 g of 3-mercaptopropionic acid in 50 g of methyl ethyl ketone. Separately, a 500 ml three-neck flask equipped with a thermometer and a dropping funnel was charged with 50 g of methyl ethyl ketone and purged with nitrogen for 30 minutes. After the nitrogen purge, the previously prepared monomer solution was added dropwise using the dropping funnel over two hours while stirring the content of the flask using a magnetic stirrer and heating at 80° C. After the addition, the reaction was continued for a further two hours and the resultant reaction mixture was cooled to 30° C. or less to obtain a copolymer solution.

150 g of the polymer solution was transferred to a separating funnel, to which 50 g of methanol and 600 g of n-hexane were added to separate and purify the copolymer. The separated lower layer was recovered and diluted with methyl ethyl ketone to make the amount 100 g, which was again transferred to the separating funnel. 50 g of methanol and 600 g of n-hexane were added to the separating funnel again to separate and purify the copolymer. After the separation, the lower layer was recovered. The recovered lower layer was replaced with 4-methyl-2-pentanol, and the total amount was adjusted to 250 g. After separatory purification with 250 g of water, the upper layer was recovered and again replaced with 4-methyl-2-pentanol. The solid content of the sample obtained after the solvent replacement was calculated from the mass of the residue obtained by placing 0.3 g of the resin solution on an aluminum dish and heating the resin solution on a hot plate at 140° C. for one hour. The resultant solid content value was utilized for the preparation of the composition solution for forming a protective film and calculation of the yield. The Mw, the Mw/Mn, the yield of the copolymer were respectively 11090, 1.52, and 70%. The polymer is referred to a resin (A-1).

Synthesis Example 2

A monomer solution was prepared by dissolving 50 g of (1,1,1-trifluoro-2-trifluoromethyl-2-hydroxy-4-pentyl) methacrylate and 1.95 g of 2,2-azobis(methyl 2-methylisopropionate) in 50 g of methyl ethyl ketone. Separately, a 500 ml three-neck flask equipped with a thermometer and a dropping funnel was charged with 50 g of methyl ethyl ketone and purged with nitrogen for 30 minutes. After the nitrogen purge, the previously-prepared monomer solution was added dropwise using a dropping funnel over two hours while stirring the content of the flask using a magnetic stirrer and heating at 80° C. After the addition, a copolymer solution was obtained in the same manner as in Synthesis Example 1, except for reacting the mixture for another two hours, adding 1.17 g of 2,2-azobis(methyl 2-methylisopropionate), reacting again for another two hours, and cooling the mixture to 30° C. or less. The Mw, the Mw/Mn, and the yield of the copolymer were respectively 12130, 1.65, and 77%. The polymer is referred to as a resin (A-2).

Synthesis Example 3

A monomer solution was prepared by dissolving 46.95 g (85 mol %) of (1,1,1-trifluoro-2-trifluoromethyl-2-hydroxy-4-pentyl)methacrylate and 6.91 g of an initiator (2,2'-azobis (methyl 2-methylpropionate) in 100 g of isopropanol. Separately, a 500 ml three-neck flask equipped with a thermometer and a dropping funnel was charged with 50 g of isopropanol and purged with nitrogen for 30 minutes. After the nitrogen purge, the previously-prepared monomer solution was added dropwise using a dropping funnel over two hours while stirring the content of the flask using a magnetic stirrer and heating at 80° C. After the addition, the mixture was reacted for one hour and 10 g of an isopropanol solution containing 3.05 g (15 mol %) of vinyl sulfonic acid was added dropwise over 30 minutes. The mixture was reacted for another one hour and cooled to 30° C. or less to obtain a copolymer solution.

The copolymer solution was concentrated to 150 g. Then, 50 g of methanol and 600 g of n-hexane were added to the concentrated solution using a separating funnel to separate and purify the solution. The separated lower layer was recovered and diluted with isopropanol to make the amount 100 g, which was again transferred to a separating funnel. 50 g of methanol and 600 g of n-hexane were added to the separating funnel again to separate and purify the copolymer. After the separation, the lower layer was recovered. The recovered lower layer was replaced with 4-methyl-2-pentanol, and the total amount was adjusted to 250 g. After separatory purification with 250 g of water, the upper layer was recovered and again replaced with 4-methyl-2-pentanol. The solid content of the sample obtained after the solvent replacement was calculated from the mass of the residue obtained by placing 0.3 g of the resin solution on an aluminum dish and heating the resin solution on a hot plate at 140° C. for one hour. The resultant solid content value was utilized for the preparation of the composition solution for forming a protective film and calculation of the yield. The Mw, the Mw/Mn (monomer weight distribution), and the yield (mass %) of the resulting copolymer were respectively 9760, 1.51, and 65%. The copolymer was a fat-soluble resin having 95:5 (mol %) of the repeating units derived from (1,1,1-trifluoro-2-trifluoromethyl-2-hydroxy-4-pentyl)methacrylate and vinyl sulfonic acid. The polymer is referred to as a resin (A-3).

[Preparation of Radiation-Sensitive Resin Composition (A')]

The radiation-sensitive resin compositions for forming photoresist films were prepared using the following method.

Synthesis Example of Radiation-Sensitive Resin Compositions (A'-1) to (A'-3)

Synthesis Example 4

A monomer solution was prepared by dissolving 53.93 g (50 mol %) of the compound for forming the repeating unit (M-1), 35.38 g (40 mol %) of the compound for forming the repeating unit (M-2), and 10.69 g (10 mol %) of the compound for forming the repeating unit (M-3) in 200 g of 2-butanone and further adding 5.58 g of dimethyl 2,2'-azobis(2-methylpropionate). A 500 ml three-necked flask was charged with 100 g of 2-butanone and purged with nitrogen for 30 minutes. After the nitrogen purge, the reaction vessel was heated to 80° C. while stirring the content, and the previously-prepared monomer solution mentioned above was added dropwise using a dropping funnel over three hours. The starting time of the dropwise addition was regarded as the initiation of the polymerization, and the polymerization reaction was carried out for six hours. After the polymerization, the polymer solution was cooled with water to 30° C. or less and added to 200 g of methanol to filter the deposited white powder. The filtered white powder was washed twice with 400 g of methanol in the form of slurry, filtered, and dried at 50° C. for 17 hours to obtain a polymer in the form of a white powder (74 g, yield of 74%). The Mw of the polymer was 6900 and the Mw/Mn of the polymer was 1.70. As the result of $^{13}$C-NMR analysis, the polymer was found to be a copolymer having the repeating units (M-1), (M-2), and (M-3) at a ratio of 53.0:37.2:9.8 (mol %), and the content of the repeating unit containing the acid-dissociable group was 37.2 mol %. The polymer is referred to as an acrylic polymer (A'-1). The content of the low molecular weight component derived from each monomer in the polymer was 0.03 mass % for 100 mass % of the polymer.

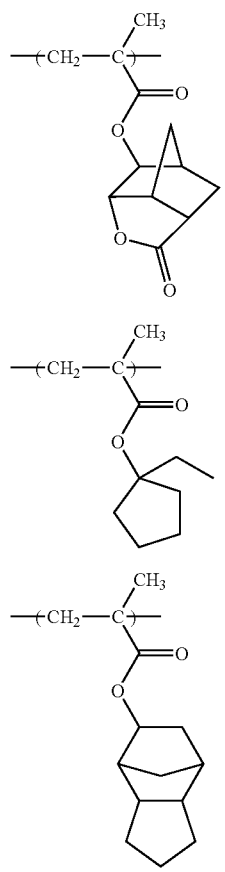

A monomer solution was prepared by dissolving 47.54 g (46 mol %) of the compound for forming the repeating unit (M-1), 12.53 g (15 mol %) of the compound for forming the repeating unit (M-2), and 39.93 g (39 mol %) of the compound for forming the repeating unit (M-4) in 200 g of 2-butanone and further adding 4.08 g of 2,2'-azobis(isobutyronitrile).

A 1000 ml three-necked flask was charged with 100 g of 2-butanone and purged with nitrogen for 30 minutes. After the nitrogen purge, the content of the three-necked flask was heated to 80° C. while stirring, and the previously-prepared monomer solution mentioned above was added dropwise using a dropping funnel over three hours. The starting time of the dropwise addition was regarded as the initiation of the polymerization, and the polymerization reaction was carried out for six hours. After the polymerization, the polymer solution was cooled with water to 30° C. or less and added to 2000 g of methanol to filter the deposited white powder. The filtered white powder was washed twice with 400 g of methanol in the form of slurry, filtered, and dried at 50° C. for 17 hours to obtain a polymer in the form of a white powder (73 g, yield of 73%). The Mw of the polymer was 5700 and the Mw/Mn of the polymer was 1.7. As the result of $^{13}$C-NMR analysis, the polymer was found to be a copolymer having the repeating units (M-1), (M-2), and (M-4) at 51.4:14.6:34.0 (mol %), and the content of the repeating unit containing the acid-dissociable group was 48.6 mol %. The polymer is referred to as a resin (A'-2).

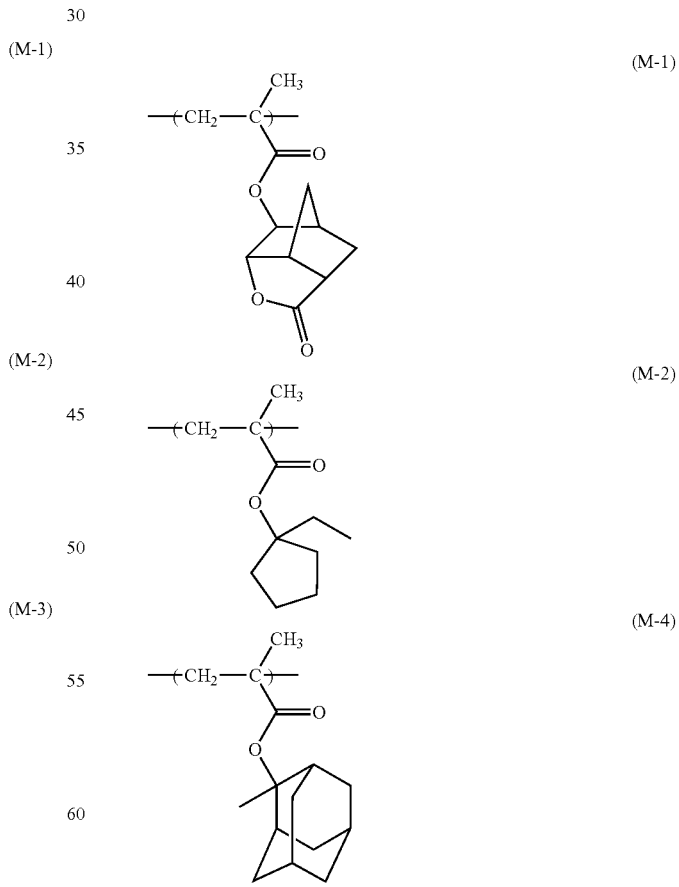

A monomer solution was prepared by dissolving 55.44 g (50 mol %) of the monomer (M-1), 33.57 g (40 mol %) of the monomer (M-5), and 10.99 g (10 mol %) of the monomer (M-3) in 200 g of 2-butanone and further adding 5.74 g of dimethyl 2,2'-azobis(2-methylpropionate). A 500 ml three-necked flask was charged with 100 g of 2-butanone and purged with nitrogen for 30 minutes. After the nitrogen purge, the mixture was stirred while heating the reaction vessel at 80° C., and the previously-prepared monomer solution mentioned above was added dropwise using a dropping funnel over three hours. The starting time of the dropwise addition was regarded as the initiation of the polymerization, and the polymerization reaction was carried out for six hours. After the polymerization, the polymer solution was cooled with water to 30° C. or less and added to 2000 g of methanol to filter the deposited white powder. The filtered white powder was washed twice with 400 g of methanol in the form of slurry, filtered, and dried at 50° C. for 17 hours to obtain a polymer in the form of a white powder (72 g, yield of 72%).

The Mw of the polymer was 6400 and the Mw/Mn of the polymer was 1.67. As the result of $^{13}$C-NMR analysis, the polymer was found to be a copolymer having the repeating units (M-1), (M-5), and (M-3) at 52.2:38.1:9.7 (mol %), and the content of the repeating unit containing the acid-dissociable group was 38.1 mol %. The polymer is referred to as a resin (A'-3). The content of the low molecular weight component derived from the above monomers in the resin (A'-3) was 0.02 mass % for 100 mass % of the polymer.

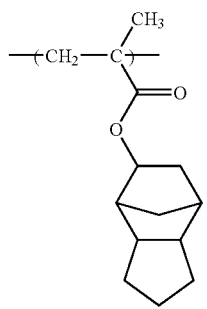

(M-3)

[Acid Generator (C)]
(C-1): triphenylsulfonium nonafluoro-n-butanesulfonate
C-2: 1-(4-n-butoxynaphthalen-1-yl)tetrahydrothiophenium nonafluoro-n-butanesulfonate
C-3: triphenylsulfonium 2-(bicyclo[2.2.1]hept-2'-yl)-1,1,2,2-tetrafluoroethanesulfonate
C-4: 1-(4-n-butoxynaphthyl)tetrahydrothiophenium 2-bicyclo[2.2.1]hept-2'-yl-0.1,1,2,2-tetrafluoroethanesulfonate
[Acid Diffusion Controller (D)]
D-1: R-(+)-(tert-butoxycarbonyl)-2-piperidinemethanol
[Solvent (E)]
E-1: propylene glycol monomethyl ether acetate
E-2: cyclohexanone
E-3: γ-butyrolactone The radiation-sensitive resin compositions (A'-1) to (A'-3) used in Examples were prepared from the components shown in Table 1.

TABLE 1

|  | Resin (A) | Parts by weight | Acid generator (C) | Parts by weight | Nitrogen-containing compound (D) | Parts by weight | Solvent (E) | Parts by weight |
|---|---|---|---|---|---|---|---|---|
| Radiation-sensitive resin composition (A'-1) | A'-1 | 30 | C-1 | 4 | D-1 | 0.83 | E-1 | 1710 |
|  | A'-2 | 70 | C-2 | 5 |  |  | E-2 | 730 |
| Radiation-sensitive resin composition (A'-2) | A'-3 | 100 | C-3 | 6.5 | D-1 | 1.1 | E-1 | 1400 |
|  |  |  | C-4 | 2 |  |  | E-2 | 600 |
|  |  |  |  |  |  |  | E-3 | 30 |
| Radiation-sensitive resin composition (A'-3) | A'-1 | 100 | C-1 | 1.5 | D-1 | 0.65 | E-1 | 2400 |
|  |  |  | C-2 | 6 |  |  | E-3 | 30 |

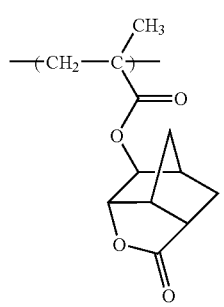

(M-1)

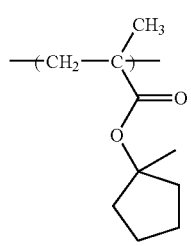

(M-5)

Examples 1 to 6 and Comparative Examples 1 to 4

The upper layer film forming composition for liquid immersion was prepared using the resins obtained in the above described Examples. The solution was prepared from the components shown in Table 2 to make the solid concentration of each resin 4 mass %, stirred for two hours, and filtered with a filter having a pore diameter of 200 nm. The nonionic compound (B) having a sulfonic acid residue group, the solvent (F), and the other additive (G) used to prepare the upper layer film forming composition are as follows.
[Compound (B) Having Sulfonic Acid Residue Group]
B-1: dodecylbenzenesulfonic acid
B-2: 5-sulfosalicylic acid
B-3: polyvinylnaphthalenesulfonic acid
[Solvent (F)]
F-1: 4-methyl-2-pentanol
F-2: diisoamyl ether
[Other Additive (G)]
G-1: EMULGENA-60

The upper layer film forming compositions prepared in Examples 1 to 6 and Comparative Examples 1 to 4 were evaluated by the following methods (1) to (6) using the radiation-sensitive resin composition (A'-1). The evaluation results are shown in Table 2. For Examples 7 to 9 and Comparative Example 5, the following items (7) to (9) were evaluated using the radiation-sensitive resin composition (A'-2), and the item (10) was evaluated using the radiation-sensitive resin composition (A'-3). The evaluation results and the composition of the upper layer film compositions used are shown in Table 3.

[Evaluation Method]

(1) Evaluation of Upper Layer Film (Removability)

Using the CLEAN TRACK ACT8 (manufactured by Tokyo Electron, Ltd.), the upper layer film was spin-coated on an 8 inches silicon wafer and baked at 90° C. for 60 seconds to obtain a film with a thickness of 90 nm. The film thickness was measured using "LAMBDA ACE VM90" (manufactured by Dainippon Screen Mfg. Co., Ltd.). After paddle development (developer: 2.38% aqueous solution of TMAH) for 60 seconds using the CLEAN TRACK ACT8, the wafer was spin-dried by swinging to observe the surface. If the resist film was developed without leaving a residue, the removability was judged as "○" and if a residue was observed, the removability was judged as "x".

(2) Measurement of Receding Angle

Promptly after the substrate (wafer) on which the film of the radiation-sensitive resin composition was formed, using "DSA-10" manufactured by KRUS Electronics Ltd, the receding angle was measured at room temperature (23° C.) and humidity of 45% under atmospheric pressure using the following methods.

<1> Adjust the wafer stage position.
<2> Set the wafer on a stage.
<3> Charge water to a needle.
<4> Minutely adjust the needle position.
<5> Inject water from the needle onto the wafer to form a 25 μl waterdrop.
<6> Withdraw the needle from the waterdrop.
<7> Insert the needle again to the position adjusted in <4>.
<8> Suck water with the needle at a rate of 10 μl/min for 90 seconds and, at the same time, measure the contact angle once every second (total of 90 times).
<9> Starting from the time when the measured contact angle values are stabilized, measure the contact angles at 20 points and average to obtain the receding contact angle.

(3) Evaluation of Intermixing (Intermixing)

A radiation-sensitive resin composition containing the above described radiation-sensitive resin (A'-1) as a resin component was spin-coated on an 8 inches silicon wafer treated with HMDS (100° C. for 60 seconds) using the CLEAN TRACK ACT8 (manufactured by Tokyo Electron, Ltd.) and prebaked on a hot plate at 90° C. for 60 seconds to form a film with a thickness of 120 nm. A film with a thickness of 90 nm was formed on this coating by applying the above described upper layer film forming composition and prebaking (PB) at 90° C. for 60 seconds. Then, the wafer was washed with ultra-pure water injected from a rinse nozzle of the CLEAN TRACK ACT8 for 60 seconds and spin-dried by rotating at 4000 rpm for 15 seconds. The upper layer film was removed by paddle development using an LD nozzle of the CLEAN TRACK ACT8 for 60 seconds. A 2.38% TMAH aqueous solution was used as the developer. The film for liquid immersion was removed in the development step, and the resist film which was not exposed remained as is. The resist film thickness was measured before and after this step using "LAMBDA ACE VM90" (manufactured by Dainippon Screen Mfg. Co., Ltd.). If the thickness change was within 5%, it was judged that there was no intermixing between the resist film and the upper layer film for liquid immersion and the intermixing was rated as "○". If the thickness change was more than 5%, the intermixing was rated as "x".

(4) Measurement of Amount of Elution (Amount of Elution)

FIG. 1 is a schematic drawing showing measurement of the amount of elution. A 30 cm×30 cm square silicone rubber sheet 4 with a thickness of 1.0 mm (manufactured by Kureha Elastomer Co., Ltd.), of which the center was cut out in the form of a disk with a diameter of 11.3 cm was superposed on the center of an 8 inches silicon wafer 2 which was previously treated with HMDS (hexamethyldisilazane) 8 at 100° C. for 60 seconds using the CLEAN TRACK ACT8 (manufactured by Tokyo Electron, Ltd.). The cut-out center of the silicon rubber was filled with 10 ml of ultra-pure water 6 using a 10 ml whole pipette.

A lower layer antireflection film 10 with a thicknesses of 77 nm ("ARC29A" manufactured by Bruwer Science) was previously formed on a silicon rubber sheet 4 using the CLEAN TRACK ACT8. A silicon wafer 14 was provided with a resist film 12 with a thicknesses of 205 nm by spin-coating a radiation-sensitive resin composition containing the radiation-sensitive resin composition (A'-1) as the resin component on the above described lower layer antireflection film and baking at 90° C. for 60 seconds. An upper layer film 13 with a thickness of 90 nm was further formed by applying the upper layer film forming composition of the Example by spin-coating using the CLEAN TRACK ACT8 and baking at 90° C. for 60 seconds. The silicon wafer 14 was the superposed on the silicon wafer in a manner such that the surface of the upper layer film 13 may come in contact with ultra-pure water 6 and the ultra-pure water 6 may not leak from the silicon rubber 4.

This state was maintained for 10 seconds. The silicon wafer 14 with the upper layer film formed thereon was removed and ultra-pure water 6 was collected using a glass injector to be used as a sample for analysis. The rate of recovery of the ultra-pure water after completion of the experiment was 95% or more.

The peak intensity of the anion part of the acid generator in the collected ultra-pure water was measured using LC-MS (a liquid chromatograph mass spectrometer, LC section: "SERIES1100" manufactured by AGILENT Corp., MS section: "Mariner" manufactured by Perseptive Biosystems, Inc.) under the following conditions. In this instance, the peak strengths of the aqueous solutions of the photoacid generator used in the radiation-sensitive resin composition which contains the above radiation-sensitive resin composition (A'-1) as the resin component with a concentration of 1 ppb, 10 ppb and 100 ppb were measured under the above conditions to prepare a calibration curve. The amount eluted was calculated from the peak strengths using the calibration curve. In the same manner, the peak strengths of the aqueous solutions of the acid diffusion controllers with a concentration of 1 ppb, 10 ppb, and 100 ppb were measured under the above conditions to prepare a calibration curve. The amount of the acid diffusion controllers eluted was calculated from the peak strengths using the calibration curve. A sample of which the elution amount was more than $5.0 \times 10^{-12}$ mol/cm$^2$ or more was indicated as "x", and those with the elution amount of $5.0 \times 10^{-12}$ mol/cm$^2$ or less was indicated as "○".

(Column Conditions)

Column: One column of "CAPCELL PAK MG" manufactured by Shiseido Co., Ltd.
Flow rate: 0.2 ml/min
Solvent: A 3:7 mixture of water and methanol, with 0.1 mass % of formic acid added
Measurement temperature: 35° C.

(5) Method of Blob Defect Evaluation

A radiation-sensitive resin composition containing the above radiation-sensitive resin (A'-1) as a resin component was spin-coated on an 8 inches silicon wafer treated with HMDS (100° C. for 60 seconds) using the CLEAN TRACK ACT 8 (manufactured by Tokyo Electron, Ltd.) and baked on a hot plate at 90° C. for 60 seconds to form a coating with a thickness of 120 nm. A film with a thickness of 90 nm was formed on this coating by applying the above described upper layer film forming composition and prebaking (PB) at 90° C. for 60 seconds. After exposure for identifying blob defects, the wafer was washed with ultra-pure water injected from a rinse nozzle of the CLEAN TRACK ACT8 for 60 seconds and spin-dried by rotating at 4000 rpm for 15 seconds. The upper layer film was removed by paddle development using an LD nozzle of the CLEAN TRACK ACT8 for 60 seconds. A 2.38% TMAH aqueous solution was used as the developer. After that, defects were inspected using a KLA2351 (manufactured by KLA Tencor). A sample in which the number of development detachment defects was not more than 200 was indicated as "○", and those with more than 200 were indicated as "x".

(6) Evaluation of Patterning

The evaluation method of patterning of a resist using the above upper layer film is described below.

After forming a film with a thicknesses of 77 nm (PB: 205° C., 60 seconds) by applying a lower layer antireflection film ARC29A (manufactured by Brewer Science) to an 8 inches silicon wafer by spin-coating using the CLEAN TRACK ACT 8 (manufactured by Tokyo Electron, Ltd.), the radiation-sensitive resin composition containing the above radiation-sensitive resin (A'-1) as a resin component was patterned. That radiation-sensitive resin composition was coated to make the thickness 120 nm by spin-coating and PB (90° C. for 60 seconds), following which the upper layer film with a thickness of 90 nm was formed by spin-coating and PB (90° C. for 60 seconds). Next, the film was exposed to radiation using an ArF projection aligner S306C (manufactured by NIKON CORP.) under the optical conditions of an NA of 0.78, ε of 0.85, and ⅔ Ann. After injecting ultra-pure water from a rinse nozzle of the CLEAN TRACK ACT8 for 60 seconds, the silicon wafer was spin-dried by rotating at 4000 rpm for 15 seconds. The coating was baked (PEB) at 115° C. for 60 seconds using a hot plate of the CLEAN TRACK ACT8, developed by paddle development for 30 seconds using an LD nozzle, rinsed with ultra-pure water and spin-dried by rotating at 4000 rpm for 15 seconds.

Figure 2:
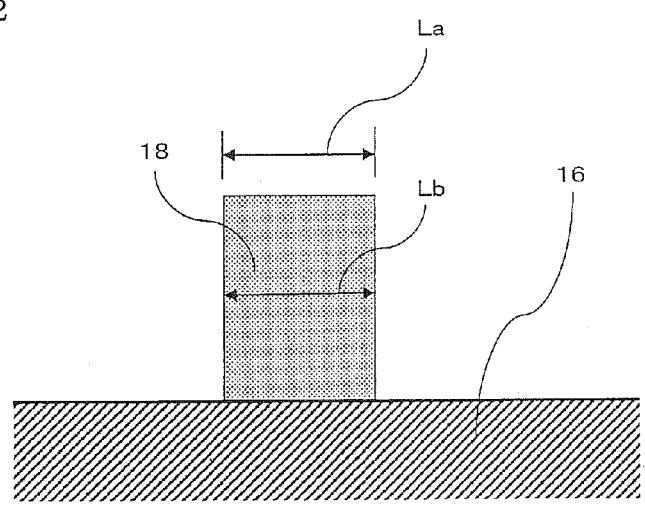
FIG. 2 is a cross-sectional view of a line- and space pattern.

An exposure dose required for forming a 1:1 line width of 90 nm in a 90 nm line-and-space (1L1S) pattern on the substrate using a scanning electron microscope (S-9380 manufactured by Hitachi High-Tech Fielding Corporation) was taken as an optimum dose. The minimum dimension of the line-and-space pattern resolved in this optimal dose was taken as resolution. The results of the evaluation are shown in Table 2. In addition, a cross-sectional form of the 90 nm line-and-space pattern was observed using a scanning electron microscope (S-4200 manufactured by Hitachi High-Tech Fielding Corporation). FIG. 2 is a cross-sectional view of a line-and-space pattern. In the pattern 18 formed on the substrate 16, a line width Lb in the middle of the film and the line width La on the upper part of the film were measured. The pattern configuration was judged as "○" when 0.9≦(La−Lb)/Lb≦1.1; as "x" when (La−Lb)/Lb<0.9 or when (La−Lb)/Lb>1.1.

TABLE 2

|  |  | Resin (A) | Parts by weight | Compound (B) | Parts by weight | Solvent (F) | Parts by weight | Other additive (G) | Parts by weight |
|---|---|---|---|---|---|---|---|---|---|
| Example | 1 | (A-2) | 100 | (B-1) | 0.1 | (F-1) | 2800 | — | — |
|  | 2 | (A-2) | 100 | (B-1) | 0.5 | (F-1) | 2800 | — | — |
|  | 3 | (A-2) | 100 | (B-2) | 0.1 | (F-1) | 2800 | — | — |
|  | 4 | (A-2) | 100 | (B-2) | 0.25 | (F-1) | 2800 | — | — |
|  | 5 | (A-2) | 100 | (B-2) | 0.5 | (F-1) | 2800 | — | — |
|  | 6 | (A-2) | 100 | (B-3) | 3.0 | (F-1) | 2800 | — | — |
| Comparative Example | 1 | (A-1) | 100 | — | — | (F-1) | 2800 | — | — |
|  | 2 | (A-2) | 100 | — | — | (F-1) | 2800 | — | — |
|  | 3 | (A-2) | 100 | — | — | (F-1) | 2800 | (G-1) | 1.0 |
|  | 4 | (A-3) | 100 | — | — | (F-1) | 2800 | — | — |

|  |  | Removability | Receding contact angle | Intermixing | Elution | Blob defect | Patterning |
|---|---|---|---|---|---|---|---|
| Example | 1 | ○ | 74 | ○ | ○ | ○ | ○ |
|  | 2 | ○ | 72 | ○ | ○ | ○ | ○ |
|  | 3 | ○ | 74 | ○ | ○ | ○ | ○ |
|  | 4 | ○ | 74 | ○ | ○ | ○ | ○ |
|  | 5 | ○ | 72 | ○ | ○ | ○ | ○ |
|  | 6 | ○ | 74 | ○ | ○ | ○ | ○ |
| Comparative Example | 1 | ○ | 72 | ○ | ○ | X | ○ |
|  | 2 | ○ | 74 | ○ | ○ | X | ○ |
|  | 3 | ○ | 74 | ○ | ○ | X | ○ |
|  | 4 | ○ | 69 | ○ | ○ | X | ○ |

As shown in Table 2, stable films which do not cause intermixing with the resist can be formed in the liquid immersion lithography in Examples 1 to 6. These films in particular can suppress the development detachment defect.

(7) Sensitivity (Liquid Immersion Lithography)

A 12 inches silicon wafer having a lower layer antireflection film ("ARC29A" manufactured by Brewer Science) with a thickness of 77 nm formed thereon was used as a substrate. "CLEAN TRACK ACT12" (manufactured by Tokyo Electron Ltd.) was used for preparing the lower layer antireflection film.

Next, using the CLEAN TRACK ACT12, the radiation-sensitive resin composition (A'-2) was spin-coated on the above substrate and baked (PB: 115° C. for 60 seconds) to prepare a film with a thickness of 120 nm. After PB, the upper layer film with a thickness of 90 nm was formed by spin-coating and PB (90° C. for 60 seconds), provided that the upper layer film forming step was omitted in Comparative Example 5. The resulting substrate was exposed to radiation through a mask pattern using an ArF excimer laser liquid immersion photolithography device ("ASML AT1250i" manufactured by ASML, NA=0.85, $\sigma_0/\sigma_1$=0.96/0.76, Dipole). Pure water was used as an immersion liquid between the upper surface of the resist and the lens of the liquid immersion lithography device. After PB (115° C. for 60 seconds), the resist was developed using a 2.38 mass % aqueous solution of tetramethylammonium hydroxide at 23° C. for 60 minutes, washed with water, and dried to obtain a positive-tone resist pattern. In this instance, an exposure amount required for forming a 1:1 line-and-space pattern (1L1S) with a line width of 65 nm was regarded as an optimal exposure dose, which was taken as sensitivity (ii). A scanning electron microscope ("S-9380" manufactured by Hitachi High Technologies Corp.) was used for measuring the length.

(8) Depth of Focus (DOF)

A line-and-space pattern (1L1S) with a line width of 65 nm was formed in the same manner as in (7) above. In this instance, the dose required for forming the line-and-space pattern in a 1:1 line width, which is the depth of focus performance (DOF performance) at the sensitivity (optimal exposure dose) shown in Table 3, was measured using a scanning electron microscope ("S-9380" manufactured by Hitachi High-Technologies Corporation).

(9) Cross-Sectional Configuration of Pattern (Liquid Immersion Lithography)

The cross-sectional configuration of a 65 nm line-and-space pattern (1L1S) obtained in the same manner as in (7) above was inspected to measure the line width Lb in the middle of the resist pattern and the line width La on the upper part of the film using an "S-4800" manufactured by Hitachi High-Technologies Corporation as shown in FIG. 2. The configuration was judged as "Good" when $0.9 \leq (La-Lb)/Lb \leq 1.1$ was satisfied, and otherwise as "Bad".

(10) Number of Defects (Number of Small Bridge-Type Defects and Number of Watermark Defects)

A 12 inches silicon wafer having a lower layer antireflection film ("ARC29A" manufactured by Brewer Science) with a thickness of 77 nm formed thereon was used as a substrate. The CLEAN TRACK ACT12 (manufactured by Tokyo Electron Ltd.) was used for preparing the lower layer antireflection film.

Next, using the CLEAN TRACK ACT12, the radiation-sensitive composition (A'-3) was spin-coated on the above substrate and baked (PB: 115° C. for 60 seconds) to prepare a film with a thickness of 120 nm. After PB, the upper layer film with a thickness of 90 nm was formed by spin-coating and PB (90° C. for 60 seconds), provided that the upper layer film forming step was omitted in Comparative Example 5. The resulting substrate was exposed to radiation through a mask pattern using an ArF excimer laser liquid immersion photolithography device ("ASML AT1250i" manufactured by ASML, NA=0.85, $\sigma_0/\sigma_1$=0.96/0.76, Annular). Pure water was used as an immersion liquid between the upper surface of the resist and the lens of the liquid immersion lithography device. After PB (115° C. for 60 seconds), the resist was developed using a 2.38 mass % aqueous solution of tetramethylammonium hydroxide at 23° C. for 60 minutes, washed with water, and dried to obtain a positive-tone resist pattern. In this instance, an exposure amount required for forming a 1:1 line-and-space pattern (1L1S) with a line width of 100 nm was regarded as an optimal exposure dose, which was taken as sensitivity. A scanning electron microscope ("S-9380" manufactured by Hitachi High Technologies Corp.) was used for measuring the length.

After that, the number of defects on a 1:1 line-and-space pattern (1L1S) with a line width of 100 nm was counted using a "KLA2351" manufactured by KLA Tencor Corp. In addition, the defects counted by the "KLA2351" were observed using a scanning electron microscope ("S-9380" manufactured by Hitachi High Technologies Corp.) to classify the defects into small bridge-type defects and watermark defects, which are thought to be derived from exposure to an ArF excimer laser by liquid immersion lithography. The results are shown in Table 3. A small bridge-type defect refers to a type of the defect which can be observed by exposure to a general ArF excimer laser without using pure water between the resist composition and the upper surface of the lens.

TABLE 3

| | | Upper layer film forming composition | | | | | | | Sensitivity (liquid immersion exposure) (mJ/cm$^2$) | Depth of focus (nm) | Pattern shape | Defects | |
|---|---|---|---|---|---|---|---|---|---|---|---|---|---|
| | | Resin (A) | Parts by weight | Compound (B) | Parts by weight | Solvent (F) | Parts by weight | Other additive (G) | Parts by weight | | | | Bridge | Watermark |
| Example | 7 | (A-2) | 100 | (B-2) | 0.25 | (F-1) (F-2) | 1680 1120 | — | — | 26 | 500 | Good | 0 | 1 |
| | 8 | (A-3) | 100 | | | (F-1) | 2800 | — | — | 24 | 500 | Good | 2 | 2 |
| | 9 | (A-3) | 100 | | | (F-1) (F-2) | 1680 1120 | — | — | 24 | 500 | Good | 2 | 4 |
| Comparative Example | 5 | Without upper layer film | | | | | | | | 26 | 500 | Bad | 2 | 22 |

INDUSTRIAL APPLICABILITY

Due to the use of the resin (A) and the compound (B), the upper layer film forming composition of the present invention can form a film which protects a photoresist film, is stably maintained without eluting the components into a medium such as water during liquid immersion lithography, can form a resist pattern with high resolution while effectively suppressing a watermark defect and a pattern defect, and can also suppress a blob defect. The composition can be extremely suitable for use in production of semiconductor devices which are expected to be further miniaturized in the future.

The invention claimed is:

1. A method of forming a photoresist pattern comprising:
    a step of forming a photoresist film by applying a photoresist to a substrate;
    a step of forming an upper layer film on the photoresist film; and a step of forming a resist pattern by irradiating the photoresist film and the upper layer film with radiation via water through a mask having a specific pattern, and developing the resist pattern, wherein the step of forming an upper layer film is carried out using an supper layer film forming composition comprising:
(A) a resin dissolvable in a developer for the photoresist film; and
(B) a compound shown by the following formula (2),

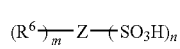
(2)

wherein $R^6$ individually represents a linear or branched alkyl group having 1 to 10 carbon atoms, an alicyclic alkyl group having 3 to 10 carbon atoms or a derivative thereof, a hydroxyl group, a carboxyl group, an alkyl ether group, an alkyloxycarbonyl group, or an alkylcarbonyloxy group; Z represents a linear, branched or alicyclic hydrocarbon having 4 to 12 carbon atoms or a substituted or unsubstituted aromatic hydrocarbon; m is 0 to 4; and n is 1 to 4, wherein the resin (A) has at least one repeating unit selected from repeating units shown by the following formulas (I-1), (I-2), and (I-3),

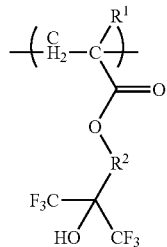
(I-1)

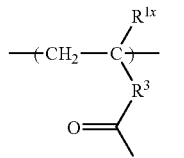
(1-2)

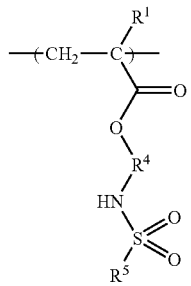
(1-3)

wherein $R^1$ represents a hydrogen atom, a methyl group, or a trifluoromethyl group, $R^2$, $R^3$, and $R^4$ represent a single bond or a divalent organic group, $R^5$ represents a linear or branched alkyl group having 1 to 10 carbon atoms in which at least one hydrogen atom is substituted by a fluorine atom or an alicyclic alkyl group having 3 to 10 carbon atoms, and $R^{1x}$ represents a linear or branched alkyl group having 1 to 3 carbon atoms in which at least one hydrogen atom is substituted by a fluorine atom, wherein an amount of the compound (B) is 3 parts by mass or less for 100 parts by mass of the resin (A).

2. The method according to claim 1, wherein the photoresist is a radiation-sensitive resin composition comprising (a) a resin containing an acid-dissociable group and (b) an acid generator, the resin (a) containing a repeating unit having an acid-dissociable group in an amount of 30 to 60 mol % of the total amount of the resin (a).

3. The method according to claim 1, wherein Z in the formula (2) showing the compound (B) is a group derived from an aromatic hydrocarbon.

* * * * *